United States Patent
Chin et al.

(10) Patent No.: US 8,952,608 B2
(45) Date of Patent: Feb. 10, 2015

(54) DONOR SUBSTRATE FOR LASER INDUCED THERMAL IMAGING METHOD AND METHOD OF FABRICATING ORGANIC LIGHT EMITTING DISPLAY DEVICE USING THE SAME

(75) Inventors: Byung-Doo Chin, Seongnam-si (KR); Mu-Hyun Kim, Suwon-si (KR); Seong-Taek Lee, Suwon-si (KR); Myung-Won Song, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 3112 days.

(21) Appl. No.: 11/017,647

(22) Filed: Dec. 22, 2004

(65) Prior Publication Data

US 2006/0043881 A1    Mar. 2, 2006

(30) Foreign Application Priority Data

Aug. 27, 2004    (KR) .......................... 10-2004-0068155

(51) Int. Cl.
| | | |
|---|---|---|
| *H01L 51/48* | (2006.01) | |
| *H01L 51/00* | (2006.01) | |
| *H01L 51/56* | (2006.01) | |

(52) U.S. Cl.
CPC ......... *H01L 51/0013* (2013.01); *H01L 51/0036* (2013.01); *H01L 51/0039* (2013.01); *H01L 51/0043* (2013.01); *H01L 51/56* (2013.01)
USPC ....................................................... 313/504

(58) Field of Classification Search
USPC ............ 313/498–512; 315/169.3; 345/36, 45, 345/76
See application file for complete search history.

(56) References Cited

U.S. PATENT DOCUMENTS

| | | | |
|---|---|---|---|
| 5,308,737 A | | 5/1994 | Bills et al. |
| 5,998,045 A | * | 12/1999 | Chen et al. .................... 428/690 |
| 6,140,009 A | * | 10/2000 | Wolk et al. .................... 430/200 |
| 2001/0012572 A1 | * | 8/2001 | Araki ............................. 428/690 |
| 2001/0033135 A1 | * | 10/2001 | Duggal et al. ................. 313/506 |
| 2002/0172813 A1 | | 11/2002 | Ogura et al. |
| 2003/0045642 A1 | | 3/2003 | Wu et al. |

(Continued)

FOREIGN PATENT DOCUMENTS

| | | |
|---|---|---|
| CN | 1337905 | 2/2002 |
| CN | 1407838 | 4/2003 |
| CN | 1484476 | 3/2004 |

(Continued)

OTHER PUBLICATIONS

Chinese Office Action dated Mar. 7, 2008.

(Continued)

*Primary Examiner* — Anne Hines
*Assistant Examiner* — Christopher Raabe
(74) *Attorney, Agent, or Firm* — H.C. Park & Associates, PLC (57) ABSTRACT

A donor substrate for a laser induced thermal imaging method and method of fabricating an organic light emitting display device using the same are provided. A transfer layer for a laser induced thermal imaging method is made of an organic material having a molecular weight of 500 to 70,000 to fabricate an organic light emitting display device having a uniform organic layer pattern. The invention also provides a method of fabricating an organic light emitting display device which may achieve a large-sized pixel region as well as improve the productivity of the organic light emitting display device.

7 Claims, 5 Drawing Sheets

(56) References Cited

U.S. PATENT DOCUMENTS

| | | | |
|---|---|---|---|
| 2004/0100804 A1* | 5/2004 | Noguchi et al. | 362/555 |
| 2005/0147842 A1* | 7/2005 | Hirayama et al. | 428/690 |

FOREIGN PATENT DOCUMENTS

| | | |
|---|---|---|
| JP | 2002-539287 | 11/2002 |
| JP | 2003-518454 | 6/2003 |
| JP | 2003-264076 | 9/2003 |
| JP | 2004-022544 | 1/2004 |
| JP | 2004-039630 | 2/2004 |
| JP | 2004-042653 | 2/2004 |
| KR | 1020020065915 | 8/2002 |
| KR | 1020040054474 | 6/2004 |
| WO | 03-089542 | 10/2003 |

OTHER PUBLICATIONS

Japanese Office Action dated Nov. 17, 2009 for Japanese Patent Application No. 2004-377988.

* cited by examiner

DONOR SUBSTRATE FOR LASER INDUCED THERMAL IMAGING METHOD AND METHOD OF FABRICATING ORGANIC LIGHT EMITTING DISPLAY DEVICE USING THE SAME

CROSS-REFERENCE TO RELATED APPLICATION

This application claims priority to and the benefit of Korean Patent Application No. 2004-68155, filed on Aug. 27, 2004, the disclosure of which is incorporated herein by reference in its entirety.

BACKGROUND OF THE INVENTION

1. Field of the Invention

The present invention relates to a donor substrate for a laser induced thermal imaging (LITI) method and a method of fabricating an organic light emitting display device using the same, and more particularly, to a donor substrate for an LITI method, which may be easily fabricated and in which an organic layer has improved pattern characteristics, and a method of fabricating an organic light emitting display device using the same.

2. Description of the Related Art

Nowadays, with the arrival of a high-level information society, a consumer's demand for obtaining information rapidly and correctly in hand is increasing. In order to meet this demand, the development of various display devices, which are thin and light to be easily carried and operable in a high information processing rate, has been accelerated. As one example of such display devices, an organic light emitting display device (OLED) is attracting attention as a next generation display. Since, the OLED is an emissive display device in which, when a voltage is applied to an organic layer including an organic emission layer, electrons and holes are recombined in the organic emission layer to emit light, the OLED does not need a backlight unit unlike a liquid crystal display device (LCD), so its thickness and weight may be easily reduced and its fabrication process may be simplified. In addition, the OLED has other advantages such as a fast response speed nearly equal to that of a cathode ray tube (CRT), low voltage driving, high luminous efficiency, and a wide viewing angle.

The OLED may be a small molecular OLED or a polymer OLED according to the material of the organic layer, in particular, the organic emission layer.

The small molecular OLED includes multiple organic layers having different functions from each other, which are interposed between an anode and a cathode, wherein the multiple organic layers include a hole injection layer, a hole transport layer, an emission layer, a hole blocking layer and an electron injection layer. These layers may be adjusted by doping to prevent the accumulation of electric charges or replacing with a material having a suitable energy level. The small molecular OLED is generally made by a vacuum deposition method and thus it is difficult to realize a large-sized display.

On the other hand, the polymer OLED has a single layer structure having an organic emission layer interposed between an anode and a cathode or a double layer structure including a hole transport layer in addition to the organic emission layer, and thus may be fabricated into a thin device. In addition, since the organic layer is formed by a wet coating method, the polymer OLED may be fabricated under atmospheric pressure, thereby reducing the manufacturing cost and readily realizing the large-sized OLED.

In the case of a monochrome device, the polymer OLED may be simply fabricated by a spin coating method, but has disadvantages of lower efficiency and shorter lifetime compared to the small molecular OLED. In the case of a full color device, emission layers for showing three primary colors of red, green and blue may be patterned in such an OLED to realize the full color. In this case, the organic layer of the low small OLED may be patterned by a shadow mask deposition method, and the organic layer of the polymer OLED may be patterned by an ink jet printing method or a laser induced thermal imaging (hereinafter will be referred to as "LITI") method. The LITI method may utilize spin coating characteristics as they are, thereby resulting in excellent internal uniformity of pixels in the large-sized OLED. In addition, since the LITI method adopts a dry process instead of a wet process, the LITI method may prevent lifetime reduction by solvent as well as realize a fine pattern in the organic layer.

Application of the LITI method basically needs a light source, an OLED substrate (hereinafter will be referred to as "substrate") and a donor substrate, wherein the donor substrate includes a base layer, a light-to-heat conversion layer and a transfer layer. According to the LITI method, light emitted from the light source is absorbed by the light-to-heat conversion layer to convert the light into heat energy, so that an organic material formed on the transfer layer is transferred onto the substrate by the converted heat energy.

Figure 1:
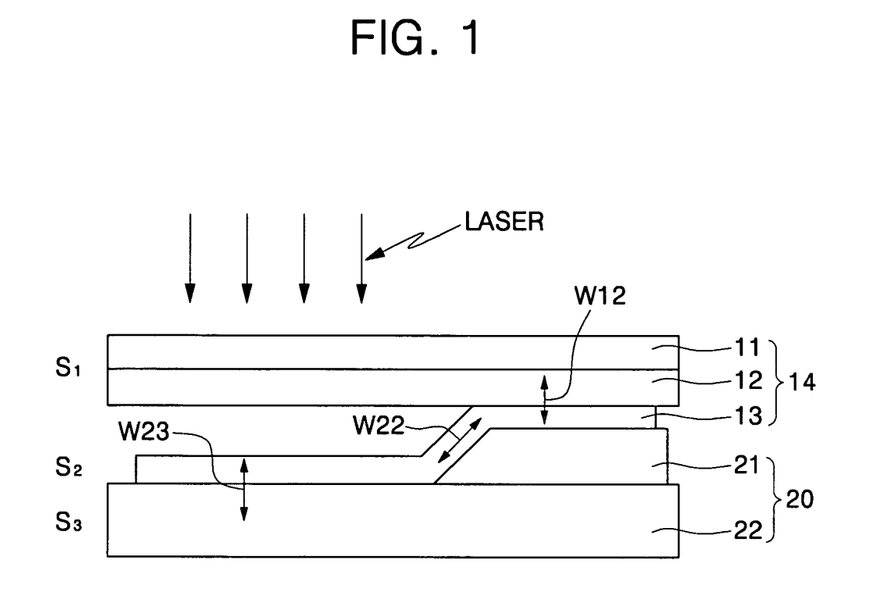
FIG. 1 is a cross-sectional view for explaining a general transfer mechanism for transfer patterning an organic layer used in an organic light emitting display device (OLED) using laser.

FIG. 1 is a cross-sectional view for explaining a general transfer mechanism for transfer patterning an organic layer used in an organic light emitting display device (OLED) using a laser.

As shown in FIG. 1, in the transfer mechanism for transfer patterning the organic layer used in the organic light emitting display device (OLED) using the laser, an organic layer S2 attached to a substrate S1, which includes a base layer 11 and a light-to-heat conversion layer 12, is detached from the substrate S1 in response to a laser beam and transferred to a substrate S3, which includes a substrate 22 and a pixel defining layer 21, to be separated from a portion in which the laser beam is not irradiated.

Transfer characteristics are determined by a first adhesion W12 between the substrate S1 and the organic layer S2, a cohesion W22 between the organic layer S2 and a second adhesion W23 between the organic layer S2 and the substrate S3.

The first and second adhesions and the cohesion are summarized as the following Equation:

$$W12 = \gamma1 + \gamma2 - \gamma12$$

$$W22 = 2\gamma2$$

$$W23 = \gamma2 + \gamma3 - \gamma23$$

where $\gamma1$, $\gamma2$ and $\gamma3$ are surface tensions of S1, S2 and S3, respectively, $\gamma12$ is the interfacial tension between S1 and S2, and $\gamma23$ is the interfacial tension between S2 and S3.

In order to improve the characteristics of the LITI, the cohesion of the organic layer should be smaller than the adhesions between the organic layer and the substrates.

In the case that the organic layer is made of a small molecular material, the first and second adhesions are larger than the cohesion of the organic layer so that the small molecular material is easily transferred from a donor substrate 14 onto a substrate 20. However, by virtue of the small first adhesion, other portions of the small molecular material layer, which are not exposed to the laser beam, may be disadvantageously transferred onto the substrate 20. Alternatively, in the case that the organic layer is made of a polymer material, uniform patterning may be difficult because of high cohesion of the polymer material.

SUMMARY OF THE INVENTION

The present invention, therefore, solves aforementioned problems associated with conventional devices by providing a donor substrate for an LITI method, which is made of an organic material and thus may improve the pattern characteristics of an organic layer, and a method of fabricating an organic light emitting display device (OLED) using the same.

In an exemplary embodiment of the present invention, a donor substrate for a laser induced thermal imaging method includes: a base layer; a light-to-heat conversion layer formed on the base layer; and a transfer layer formed on the light-to-heat conversion layer, wherein the transfer layer is made of an organic material having a molecular weight of 500 to 70,000.

In another exemplary embodiment of the present invention, a method of fabricating a donor substrate for a laser induced thermal imaging method includes: preparing a base layer; forming a light-to-heat conversion layer on the base layer; and forming a transfer layer on the light-to-heat conversion layer, wherein the transfer layer is made of an organic material having a molecular weight of 500 to 70,000.

In yet another exemplary embodiment of the present invention, a method of fabricating an organic light emitting display device (OLED), includes: preparing a substrate; forming a first electrode on the substrate; forming an organic layer on the first electrode using a laser induced thermal imaging method, the organic layer having at least an emission layer; and forming a second electrode on the organic layer, wherein the organic layer is made of an organic material having a molecular weight of 500 to 70,000.

In still another exemplary embodiment of the present invention, an organic light emitting display device (OLED) includes: a substrate having a first electrode; an organic layer formed on the substrate and having at least an emission layer; and a second electrode formed on the organic layer, wherein the organic layer has an edge roughness of about 3 μm or less.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Hereinafter, the present invention will now be described more fully with reference to the accompanying drawings.

Figure 2:
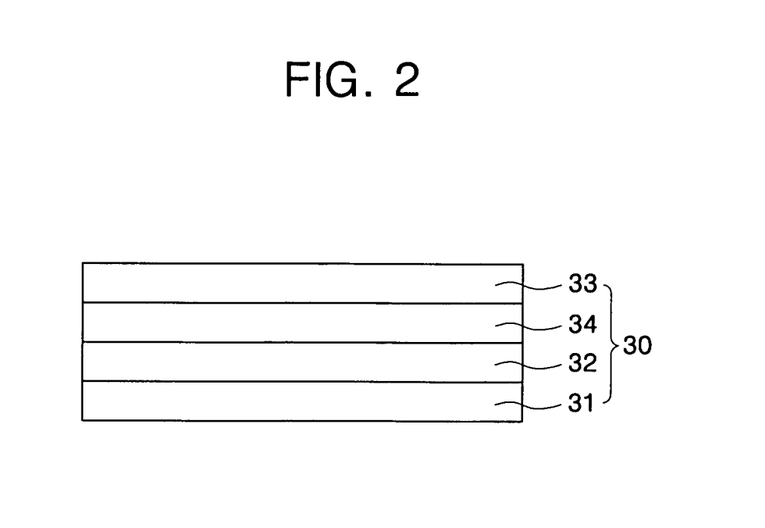
FIG. 2 is a cross-sectional view illustrating the structure of a donor substrate for an LITI method according to an embodiment of the present invention.

FIG. 2 is a cross-sectional view illustrating the structure of a donor substrate for an LITI method according to an embodiment of the present invention.

As shown in FIG. 2, a donor substrate 30 for an LITI method includes a base layer 31, a light-to-heat conversion layer 32 and a transfer layer 33 which are sequentially stacked.

The base layer 31 is preferably made of a transparent material in order to transmit a laser beam irradiated onto the base layer 31 to the light-to-heat conversion layer 32. For example, the base layer 31 may be at least one polymer selected from a group consisting of polyester, polyacryl, polyepoxy, polyethylene and polystyrene, or may be a glass substrate. More preferably, the base layer 31 may be made of polyethyleneterephthalate.

The light-to-heat conversion layer 32 formed on the base layer 31 absorbs light in the range of infrared to visible rays, and partially converts the light into heat. The light-to-heat conversion layer 32 necessarily has a suitable optical density, and preferably contains a light-absorbing material for absorbing the light. In this case, the light-to-heat conversion layer 32 may include a metal layer made of Al, Ag, oxide or sulfide thereof. Alternatively, the light-to-heat conversion layer 32 may include an organic layer made of a polymer containing carbon black, graphite or infrared dye. The metal layer may be formed by a vacuum deposition method, an electron beam deposition method or a sputtering method. On the other hand, the organic layer may be formed by a typical film coating method such as roll coating, gravure, extrusion, spin coating and knife coating.

The transfer layer 33 formed on the light-to-heat conversion layer 32 is preferably made of an organic material having a molecular weight of 500 to 70,000. More preferably, the transfer layer 33 is made of an organic material having a molecular weight of 500 to 40,000. For example, the organic material may be one selected from a group consisting of poly[(9,9-dioctylfluorene-2,7-diyl)], poly[(9,9-dihexylfluorene-2,7-diyl)-co-(anthracene-9,10-diyl)], poly[(9,9-dihexylfluorene-2,7-diyl)-co-(9,9-di-(5-phenyl)-N,N'-diphenyl-4, 4'-diyl-1,4-diaminobenzene)] and poly[(9,9-dihexylfluorene-2,7-diyl)-co-(9-ethylcarbazole-2,7-diyl)].

Preferably, the organic material is solved or dispersed in a solvent. Accordingly, the transfer layer 33 may be formed by a typical wet process. The wet process may be one selected from a group consisting of spray coating, dip coating, gravure coating, roll coating and spin coating. In this case, the transfer layer is not efficiently formed by the wet process when it is made of an organic material having a molecular weight of 500 or less.

In addition, the donor substrate 30 may further include an interlayer 34 for improving transfer characteristics between the light-to-heat conversion layer 32 and the transfer layer 33. The interlayer 34 may include at least one selected from a group consisting of a gas generation layer, a buffer layer and a metal reflection layer.

When absorbing light or heat, the gas generation layer emits nitrogen or hydrogen gas through decomposition reaction, thereby providing transfer energy. The gas generation layer may be made of tetranitropentaerythrite or trinitrotoluene.

The buffer layer prevents light-heat absorbing material from polluting or damaging the transfer layer, which is to be formed in the following process, as well as controls the adhesion between the light-heat absorbing material and the transfer layer in order to improve pattern transfer characteristics. The buffer layer may be made of metal oxide, nonmetal inorganic compound or inactive polymer.

The metal reflection layer not only reflects the laser beam from the base layer of the donor substrate in order to transmit more energy to the light-to-heat conversion layer but also protects the transfer layer against the penetration of gas from the gas generation layer when the gas generation layer is employed.

Figure 3A:
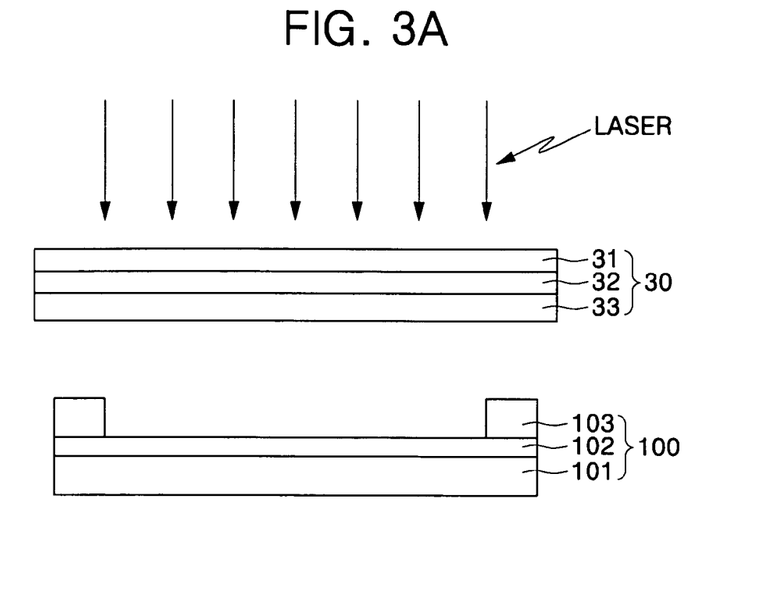
FIGS. 3A to 3C are cross-sectional views illustrating a process for fabricating an OLED according to an embodiment of the present invention.
Figure 3B:
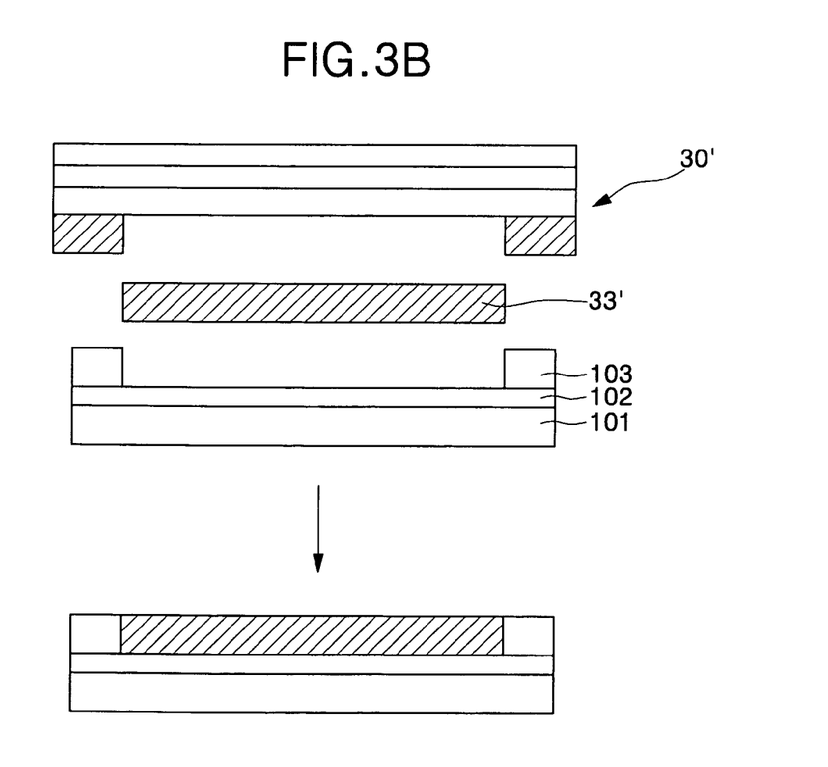
Figure 3C:
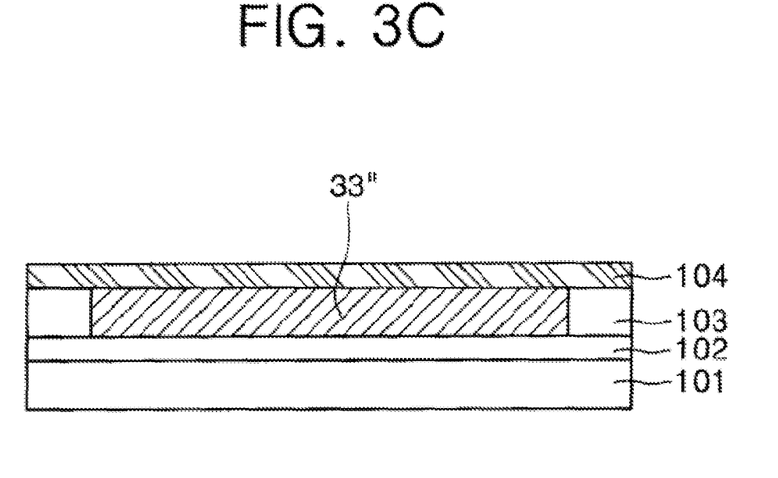

FIGS. 3A to 3C are cross-sectional views illustrating a process for fabricating an OLED according to an embodiment of the present invention.

As shown in FIG. 3A, a substrate 101 is prepared, and a first electrode 102 is patterned on the top surface of the substrate 101.

The first electrode 102 may be an anode electrode or a cathode electrode. When the first electrode 102 is an anode electrode, the first electrode 102 may be made of a metal having a high work function. For example, the first electrode 102 may be a transparent electrode made of ITO or IZO or a reflective electrode made of one selected from a group consisting of Pt, Au, Ir, Cr, Mg, Ag, Ni, Al and alloys thereof. When the first electrode 102 is a cathode electrode, the first electrode 102 may be made of a metal having a low work function. For example, the first electrode 102 may be a thin transparent electrode or a thick reflective electrode made of a material selected from Mg, Ca, Al, Ag, Ba and alloys thereof.

Then, a pixel defining layer 103 for defining a red (R), green (G) and blue (B) pixel regions is formed to fabricate a substrate 100.

FIG. 3A illustrates a single sub-pixel of the OLED, which may have an array of the sub-pixels. In addition, although not shown in FIG. 3A, the substrate 100 may include a plurality of thin film transistors and an insulating layer.

In the meantime, a light-to-heat conversion layer 32 and a transfer layer 33 are sequentially stacked on the base layer 31 to fabricate a donor substrate 30. The transfer layer 33 may be formed by a typical wet process using an organic material having a molecular weight of 500 to 70,000. The organic material more preferably has a molecular weight of 500 to 40,000.

The organic material may be one selected from a group consisting of poly[(9,9-dioctylfluorene-2,7-diyl)], poly[(9,9-dihexylfluorene-2,7-diyl)-co-(anthracene-9,10-diyl)], poly [(9,9-dihexylfluorene-2,7-diyl)-co-(9,9-di-(5-phenyl)-N,N'-diphenyl-4,4'-diyl-1,4-diaminobenzene)] and poly[(9,9-dihexylfluorene-2,7-diyl)-co-(9-ethylcarbazole-2,7-diyl)]. In addition, the organic material may be preferably solved or dispersed in a typical organic solvent.

Then, the substrate 100 is aligned with the donor substrate 30 in such a manner that the pixel region of the substrate 100 is opposed to the transfer layer 33, and then a laser beam is irradiated onto a specific region of the transfer layer 33 of the donor substrate 30 to be transferred.

Then, as shown in FIG. 3B, the specific region of the transfer layer 33, that is, a transfer layer portion 33' formed by laser irradiation is transferred to the pixel region of the substrate 100. In succession, upon the separation of the transfer layer portion 33', the donor substrate 30' is removed from the substrate 100 so that the transfer layer portion 33' forms an organic emission layer pattern 33" of the OLED.

In the same fashion as above, a laser beam may be exposed onto donor substrates having red (R), green (G) and blue (B) organic light emitting materials in the red (R), green (G) and blue (B) pixels regions, respectively, to form red (R), green (G) and blue (B) organic emission layer patterns, thereby fabricating a full color OLED.

When the first electrode 102 is an anode electrode, a hole injection layer and/or a hole transport layer may be further formed on the first electrode 102 before forming the organic emission layer pattern 33". In addition, an electron transport layer and/or an electron injection layer may be further formed on the organic emission layer pattern 33".

Alternatively, when the first electrode 102 is a cathode electrode, an electron injection layer and/or an electron transport layer may be further formed on the first electrode 102 before forming the organic emission layer pattern 33". In addition, a hole blocking layer and/or a hole injection layer and/or a hole transport layer may be formed on the organic emission layer pattern 33".

The hole injection layer is disposed on the anode electrode. In addition, the hole injection layer may be made of a material, which has a high interfacial adhesion with respect to the anode electrode and a low ionization energy, to facilitate hole injection and increase the device lifetime. The hole injection layer may be made of arylamine-based compound, porphyrin-based metal complex, starburst amines, and so on. More particularly, the hole injection layer may be made of at least one selected from a group consisting of 4,4',4"-tris(3-methylphenylphenylamino)triphenylamino (m-MTDATA), 3,5-tris[4-(3-methylphenylphenylamino)phenyl]benzene (m-MTDATB) and phthalocyanine copper (CuPc).

The hole transport layer may facilitate the transport of holes to the emission layer and restrict the motion of electrons generated from the second electrode to an emission region, thereby improving luminous efficiency. The hole transport layer may be made of one selected from a group consisting of an arylene diamine derivative, a starburst compound, a biphenyl diamine derivative having a spiro group, a ladder compound, and so on. More particularly, the hole transport layer may be made of N,N-diphenyl-N,N'-bis(4-methylphenyl)-1,1'-biphenyl-4,4'-diamine (TPD) or 4,4'-bis[N-(1-naphthyl)-N-phenylamino]biphenyl (NPB).

The hole blocking layer has hole mobility higher than electron mobility in the organic emission layer and stays in the triplet state for a long time, so that excitons generated from the emission layer are distributed in a large area, thereby preventing the degradation of luminous efficiency. The hole blocking layer may be made of one selected from a group consisting of 2-biphenyl-4-yl-5-(4-t-butylphenyl)-1,3,4-oxydiazole (PBD), spiro-PBD and 3-(4'-tert-butylphenyl)-4-phenyl-5-(4'-biphenyl)-1,2,4-triazole (TAZ).

The electron transport layer is deposited on the organic emission layer, and made of a metal compound capable of efficiently receiving electrons. The electron transport layer may be made of 8-hydroquinoline aluminum salt (Alq3) having an excellent capability for stably transporting electrons supplied from the cathode electrode.

Herein, an organic layer other than the organic emission layer as above may be formed by a spin coating or deposition method. Alternatively, an organic emission layer and at least one organic layer may be stacked so that the transfer layer of the donor substrate may be transferred simultaneous with the organic emission layer and at least one organic layer in the course of LITI.

Then, as shown in FIG. 3C, a second electrode 104 is formed on the organic layer including at least an organic emission layer. In this case, the second electrode 104 may be an anode electrode or a cathode electrode.

In case of the anode electrode, the second electrode 104 may be made of a metal having a high work function. For example, the second electrode 104 may be a transparent electrode made of ITO or IZO or a reflective electrode made of one selected from a group consisting of Pt, Au, Ir, Cr, Mg, Ag, Ni, Al and alloys thereof.

In the case of the cathode electrode, the second electrode 104 may be formed on the organic layer 33" and made of a conductive metal having a low work function. For example, the second electrode 104 may be a thin transparent electrode or a thick reflective electrode made of a material selected from Mg, Ca, Al, Ag and alloys thereof.

Then, the second electrode 104 is sealed with an encapsulant such as a metal can to fabricate the OLED.

Figure 4:
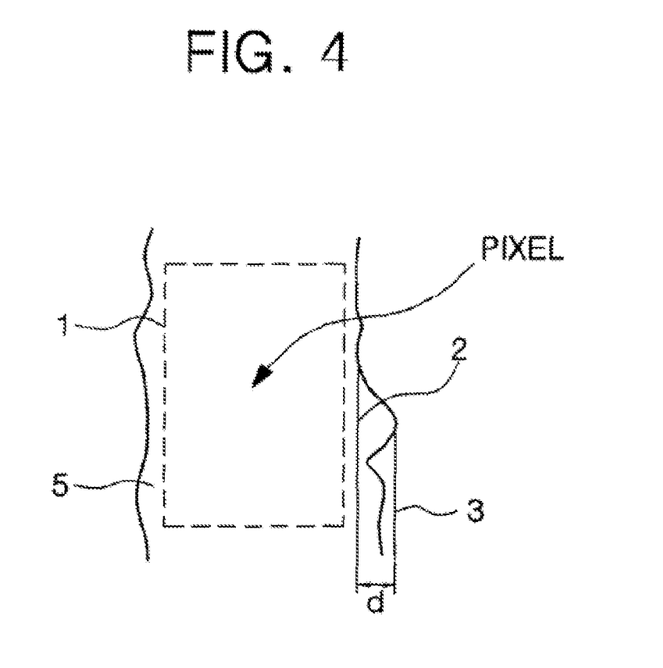
FIG. 4 is a plan view illustrating a pattern formed by an LITI method in order to explain the definition of edge roughness.

FIG. 4 is a plan view of an organic layer pattern formed by an LITI method, for explaining the definition of edge roughness.

As shown in FIG. 4, the edge roughness d means the distance between a first point 2 and a second point 3, wherein the first point 2 is the nearest point from a reference surface 1, which is a uniform edge, and the second point 3 is the farthest point from the reference surface 1. In this case, the uniformity of the organic layer pattern is in reverse proportion to the value of the edge roughness.

Figure 5:
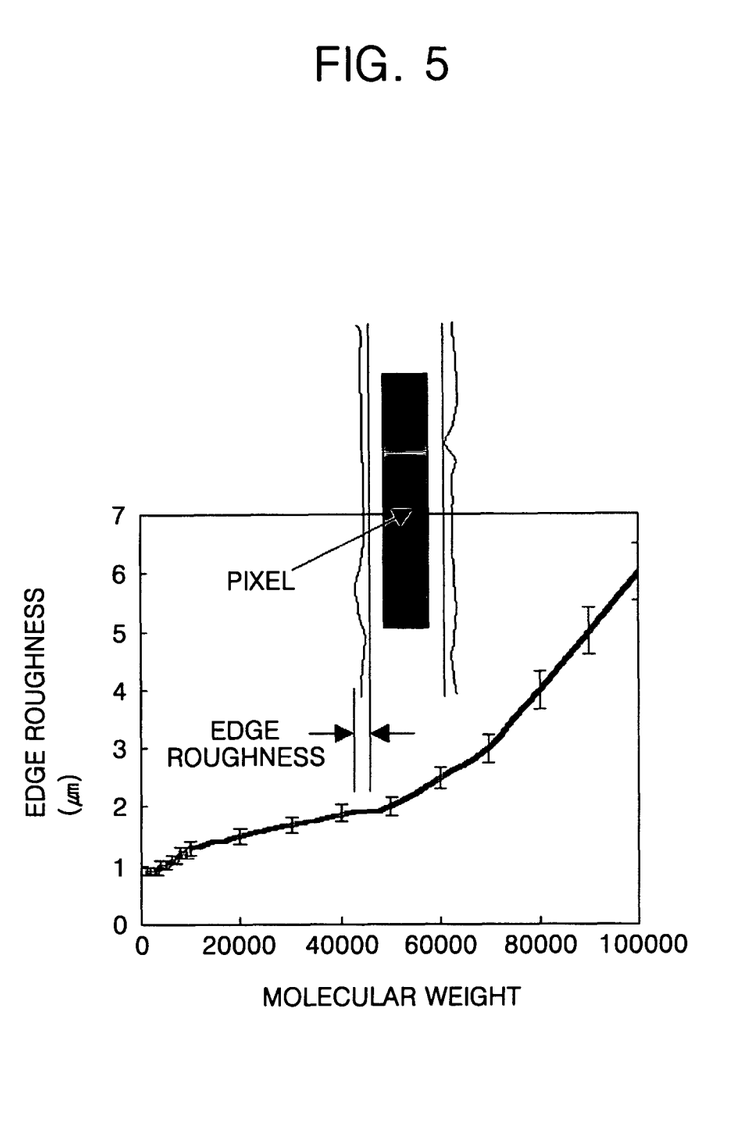
FIG. 5 is a graph showing the edge roughness of an organic layer pattern according to a molecular weight of a transfer layer material.

FIG. 5 is a graph showing the edge roughness of an organic layer pattern according to a molecular weight of a transfer layer material.

As shown in FIG. 5, it will be understood that the value of the edge roughness increases in proportion to the molecular weight of the transfer layer material. In this case, when the transfer layer material has a molecular weight of 70,000 or less, the edge roughness value is 3 μm, and a uniform pattern is formed. In addition, when the transfer layer material has a molecular weight of 40,000 or less, the edge roughness value is 2 μm or less and, thus the pattern uniformity is more improved.

Figure 6A:
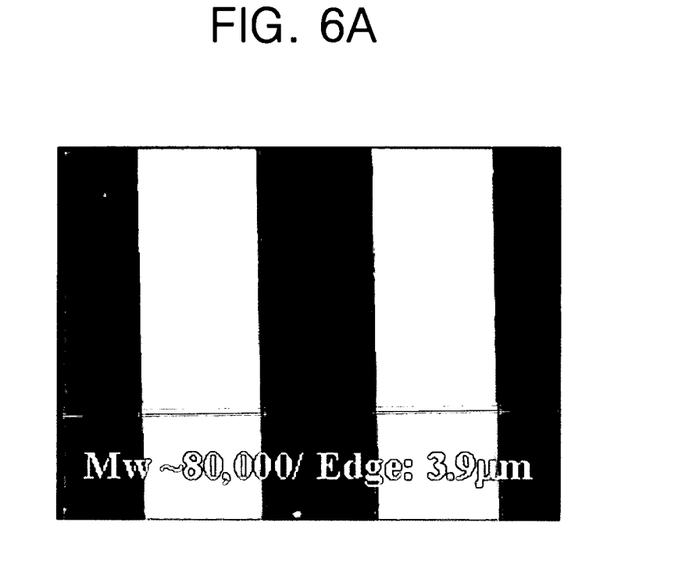
FIGS. 6A and 6B are microscopic pictures of organic layer patterns.
Figure 6B:
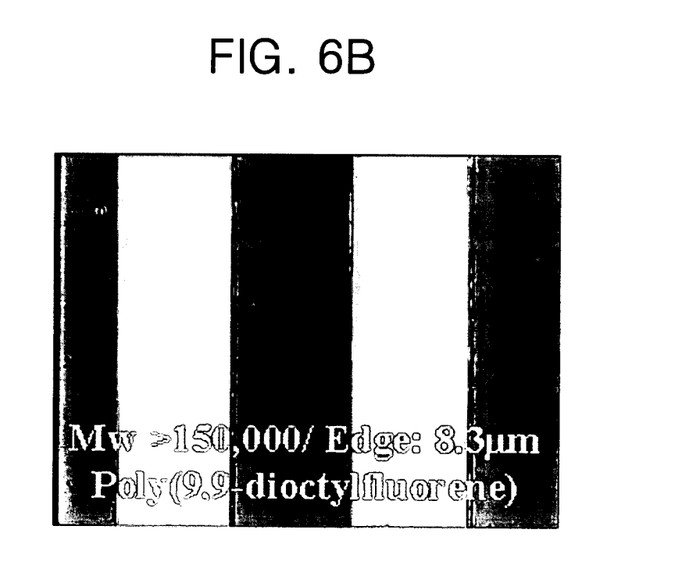

FIGS. 6A and 6B are microscopic pictures of organic layer patterns.

As shown in FIG. 6B, with an organic material having a molecular weight of 150,000, it was observed that the edge roughness of the organic layer pattern was 8.3 μm and edges of the organic layer pattern were formed to be non-uniform. In addition, as shown in FIG. 6A, with an organic material having a molecular weight of 80,000, it was observed that the edge roughness of the organic layer pattern was 3.9 μm and the edges of the organic layer pattern were formed to be more uniform than those of the organic material having the molecular weight of 150,000. Accordingly, it was observed that the edge roughness increases in proportion to the molecular weight and the organic layer pattern was formed to be non-uniform when an organic material had a molecular weight of 70,000 or more.

As described hereinbefore, the increase in molecular weight of the organic material forming the transfer layer also increases the cohesive energy between molecules to increase the cohesion between molecules, thereby causing nonuniformity of the pattern. Alternatively, when the molecular weight of the organic material forming the transfer layer is too small, it is difficult to form the transfer layer using a wet process. In addition, by virtue of small adhesion between the substrate and the transfer layer of the donor substrate, a portion of the transfer layer which is not exposed to a laser beam is not detached from the donor substrate but remains thereon, in the course of LITI, thereby potentially causing defects. Accordingly, the molecular weight of the organic material forming the transfer layer preferably has a molecular weight of 500 to 70,000. More preferably, the organic material forming the transfer layer has a molecular weight of 500 to 40,000.

As described above, the invention may form the organic layer pattern from the organic material having a molecular weight of 500 to 70,000 using an LITI method, so as to form a uniform organic layer pattern and thus fabricate the OLED having a large pixel region.

In addition, by forming the uniform organic layer pattern, the invention may fabricate the OLED capable of improving image qualities as well as realizing more improved full color.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A donor substrate for a laser induced thermal imaging method, comprising:
   a base layer;
   a light-to-heat conversion layer formed on the base layer; and
   a transfer layer formed on the light-to-heat conversion layer,
   wherein the transfer layer is made of an organic material having a molecular weight of 500 to 70,000.

2. The donor substrate according to claim 1, wherein the transfer layer is made of an organic material having a molecular weight of 500 to 40,000.

3. The donor substrate according to claim 1, wherein the transfer layer is made of a material selected from a group consisting of poly[(9,9-dioctylfluorene-2,7-diyl)], poly[(9,9-dihexylfluorene-2,7-diyl)-co-(anthracene-9,10-diyl)], poly [(9,9-dihexylfluorene-2,7-diyl)-co-(9,9-di-(5-phenyl)-N,N'-diphenyl-4,4'-diyl-1,4-diaminobenzene)] and poly[(9,9-dihexylfluorene-2,7-diyl)-co-(9-ethylcarbazole-2,7-diyl)].

4. The donor substrate according to claim 1, wherein the base layer is formed of a glass substrate or a transparent polymer substrate, the transparent polymer substrate being made of one selected from a group consisting of polyester, polyacryl, polyepoxy, polyethylene, polypropylene and polystyrene.

5. The donor substrate according to claim 1, wherein the light-to-heat conversion layer is made of a material selected from a group consisting of an organic material, metal, metal oxides, metal sulfides and alloys thereof which contain a light absorbing material.

6. The donor substrate according to claim 1, further comprising an interlayer on the light-to-heat conversion layer.

7. The donor substrate according to claim 6, wherein the interlayer is made of at least one selected from a group consisting of a gas generation layer, a buffer layer and metal reflection layer.

* * * * *